United States Patent
Hattori

(10) Patent No.: US 7,338,723 B2
(45) Date of Patent: Mar. 4, 2008

(54) ALUMINUM NITRIDE SUBSTRATE AND PRODUCTION METHOD

(75) Inventor: Akiyoshi Hattori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 28 days.

(21) Appl. No.: 11/081,093

(22) Filed: Mar. 15, 2005

(65) Prior Publication Data

US 2005/0215415 A1    Sep. 29, 2005

(30) Foreign Application Priority Data

Mar. 29, 2004   (JP)   ............................ P2004-096032

(51) Int. Cl.
*C04B 35/581*   (2006.01)

(52) U.S. Cl. .................................... 428/698

(58) Field of Classification Search ................ 428/498, 428/408, 208, 209
See application file for complete search history.

(56) References Cited

U.S. PATENT DOCUMENTS

| | | | |
|---|---|---|---|
| 4,578,364 A | 3/1986 | Huseby et al. | |
| 4,766,097 A | 8/1988 | Shinozaki et al. | |
| 5,993,699 A | 11/1999 | Katsuda et al. | |
| 6,271,163 B1 * | 8/2001 | Yushio et al. | 501/98.5 |
| 6,900,149 B1 * | 5/2005 | Ito et al. | 501/98.4 |
| 6,964,812 B2 * | 11/2005 | Ito et al. | 428/408 |

FOREIGN PATENT DOCUMENTS

| | | |
|---|---|---|
| JP | 60-127267 A1 | 7/1985 |
| JP | 02-307871 A1 | 12/1990 |
| JP | 09-048668 A1 | 2/1997 |
| JP | 10-338574 A1 | 12/1998 |
| JP | 2001-223256 A1 | 8/2001 |
| JP | 2002-110773 A1 | 4/2002 |
| JP | 2004-083291 A1 | 3/2004 |
| WO | WO 01/17927 A1 * | 3/2001 |

OTHER PUBLICATIONS

"SHO-60 Annual Conference Proceedings of the Ceramic Society of Japan (in 1985, pp. 517-518, by Shinozaki et al.)" and the English translation thereof.

* cited by examiner

*Primary Examiner*—Jennifer McNeil
*Assistant Examiner*—Daniel Miller
(74) *Attorney, Agent, or Firm*—Burr & Brown

(57) ABSTRACT

An aluminum nitride substrate comprises a planar sintered aluminum nitride body containing carbon including free carbon and a substantially planar electrode buried in the sintered aluminum nitride body. The sintered aluminum nitride body includes a work mounting portion for placing a work thereon and a base layer having the electrode buried therein. The average concentration of free carbon in the work mounting portion different from the average concentration of free carbon in the base layer.

3 Claims, 6 Drawing Sheets

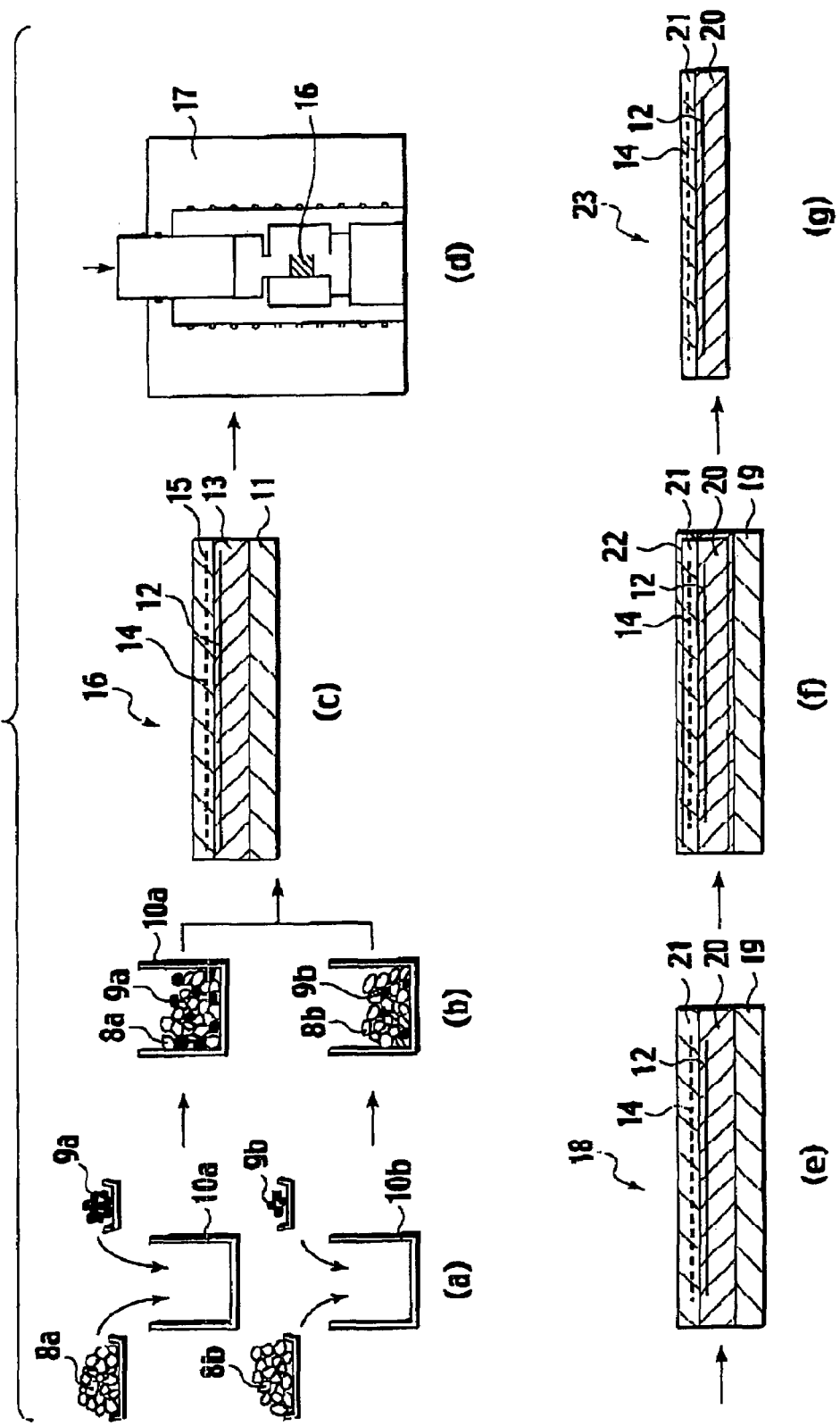
Appendix C

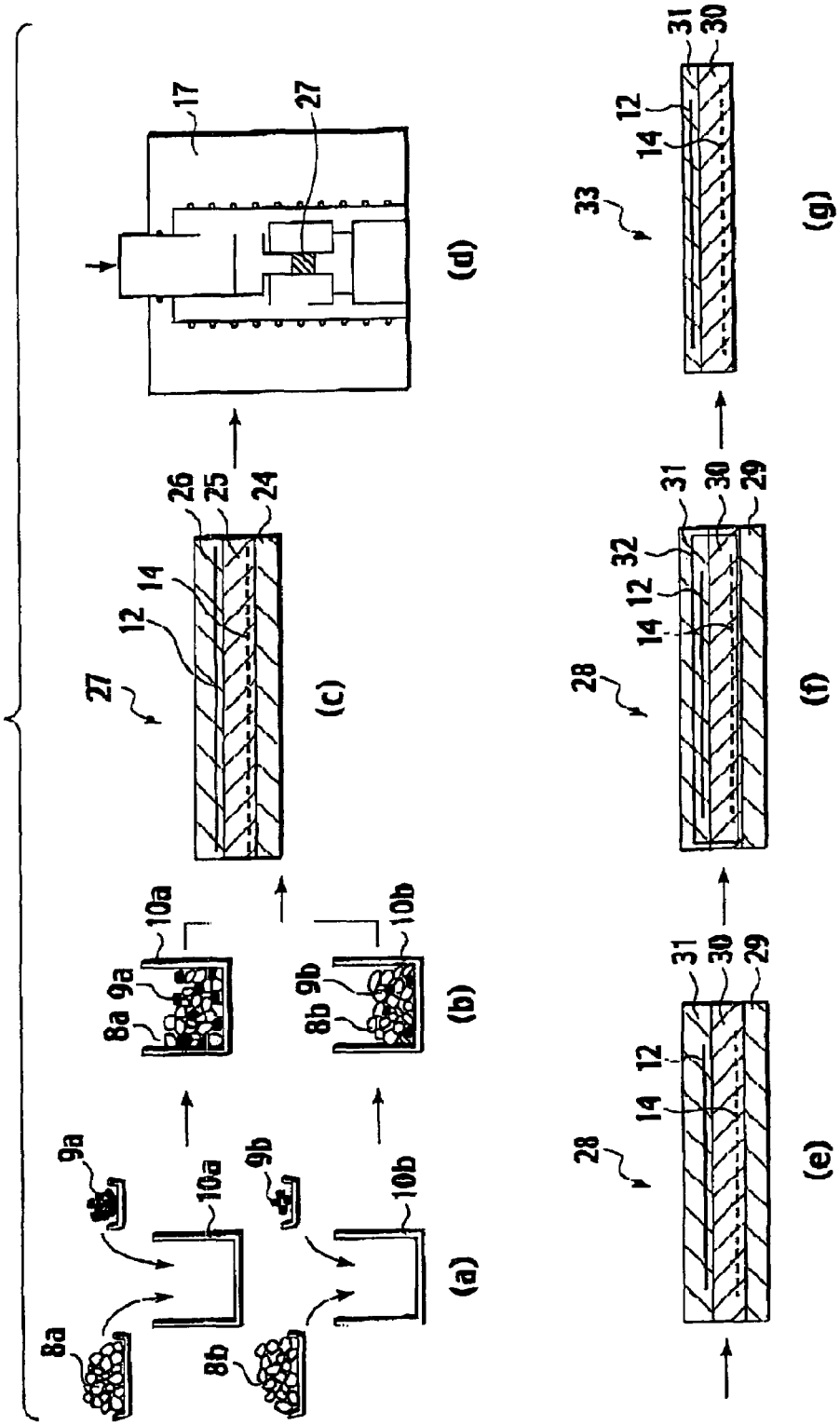
Appendix C

ALUMINUM NITRIDE SUBSTRATE AND PRODUCTION METHOD

BACKGROUND OF THE INVENTION

1. Field of the Invention

The invention relates to an aluminum nitride substrate for a semiconductor production and/or inspection apparatus, and a production method of the same.

2. Description of the Related Art

Aluminum nitride (AlN), which has a relatively high thermal conductivity about 320 W/mK, is excellent in electric insulation property, mechanical strength, and bondability to metal conductors, so that sintered aluminum nitride bodies obtained by firing aluminum nitride powder have been known as IC substrates or package materials. However, it actually is difficult to obtain a sintered aluminum nitride body having a high thermal conductivity, by firing aluminum nitride powder. Thus, methods for improving thermal conductivity of aluminum nitride have been developed.

One method includes: before firing, densifying AlN particles that have excellent covalent bondability and that are difficult to be sintered, so that the sintered AlN body is improved in thermal conductivity. For example, there is disclosed a method of densifying AlN particles by the addition of a sintering aid (yttria ($Y_2O_3$)) in SHO-60 Annual Conference Proceedings of the Ceramic Society of Japan (in 1985, pp. 517-518, by Shinozaki et al.).

Another method includes: adding a substance that is bondable to oxides in a sintered AlN body, and removing oxides therefrom, thereby improving the thermal conductivity of the sintered AlN body. It is supposed that, after such oxidation, the sintered AlN body has resultant voids, which obstruct the transmission of phonons contributing to heat conduction, so that the thermal conductivity is decreased.

For example, Japanese Patent Application Laid-Open Publication No. 60-127267 discloses a method of adding a sintering aid (yttria ($Y_2O_3$)), and trapping AlN oxides. Further, Japanese Patent Application Laid-Open Publication No. 61-146769 (counterpart of U.S. Pat. No. 4,578,364 to Huseby et al.) discloses a method of adding carbon for a reaction with oxide, and removing the reaction products.

In turn, Japanese Patent Application Laid-Open Publication No. 9-48668 discloses an AlN ceramic with a sintered AlN body having improved thermal conductivity and strength (page 5, and FIG. 1). Further, Japanese Patent Application Laid-Open Publication No. 2001-223256, which relates to a sintered carbon-containing ceramic body constituting a ceramic substrate for semiconductor production or inspection (page 8, and FIG. 1), discloses rendering the concentration of carbon to be uneven, so that an electrode pattern is prevented from being seen through the ceramic substrate, while adjusting the volume resistivity of ceramic substrate.

If the thermal conductivity of the AlN sintered body is improved by adding an amount of particles of carbon (hereafter sometimes simply called "carbon") to AlN powder in a conventional manner, the sintered AlN body tends to have an irregular-colored appearance, and suffers from varieties of problems with product quality. Particularly, the adoption of AlN powder including excessive carbon leads to complicated firing so that the crystal grains in the sintered AlN body tend to be separated, thereby deteriorating the quality of the ceramic substrate. Further, when excessively added carbon is left partially unreacted in the sintered AlN body, the densification of the sintered AlN body is obstructed, which cause deterioration in the thermal conductivity of the sintered AlN body. In this respect, although the Japanese Patent Publication No. 60-127267 has added carbon in an amount sufficient to stoichiometrically react with the oxygen (oxides) contained in the AlN powder, the mere optimization of the amount of carbon fails to produce a sintered AlN body having a high thermal conductivity.

Further, although the Japanese Patent Application Laid-Open Publication No. 2001-223256 achieved a non-uniform carbon concentration in the ceramic substrate, it is impossible to control the existence form of carbon, and carbon that is possibly present in a grain boundary of the sintered AlN body tends to cause grain separation, thereby resulting in deteriorated quality.

SUMMARY OF THE INVENTION

The present invention has been made in view of the foregoing points, and it is therefore an object of the invention to provide a product which satisfies properties required by the respective portions.

To achieve the object, properties required by the respective portions are improved by providing a variation in an average concentration of free carbon in a sintered aluminum nitride body.

Namely, according to a first aspect of the invention, an aluminum nitride substrate is provided, which comprises a planar sintered aluminum nitride body containing carbon including free carbon, and a one-dimensional or two-dimensional electrode buried in the sintered aluminum nitride body. The sintered aluminum nitride body comprises a work mounting portion for placing a work thereon and a base layer having the electrode buried therein. An average concentration of free carbon in the work mounting portion is different from an average concentration of free carbon in the base layer.

Further, according to a second aspect of the invention, a method for producing an aluminum nitride substrate is provided, which comprises the steps of using at least two types of aluminum nitride powders having different carbon concentrations of 600 ppm or lower, respectively, burying an electrode within the powders and molding them into an aluminum nitride mold in a structure comprising at least two layers having different carbon concentrations, and firing the obtained aluminum nitride mold at 1,700° C. to 1,950° C., to form an aluminum nitride substrate comprising a work mounting portion for placing a work thereon, and a base layer having the electrode buried therein, wherein the average concentration of free carbon in the work mounting portion is different from an average concentration of free carbon in the base layer.

BRIEF DESCRIPTION OF THE DRAWINGS

The above and further objects, features, and advantages of the invention will appear more fully from the detailed description of the preferred embodiments, when the same is read in conjunction with the accompanying drawings, in which:

FIG. 3 is a process chart of a method of producing an aluminum nitride substrate according to the embodiment;

FIG. 4 is another process chart of a method of producing an aluminum nitride substrate according to the embodiment;

DETAILED DESCRIPTION OF THE INVENTION

Aluminum nitride substrates and production methods thereof according to preferred embodiments of the invention are described in detail below, with reference to the accompanying drawings.

Figure 1A:
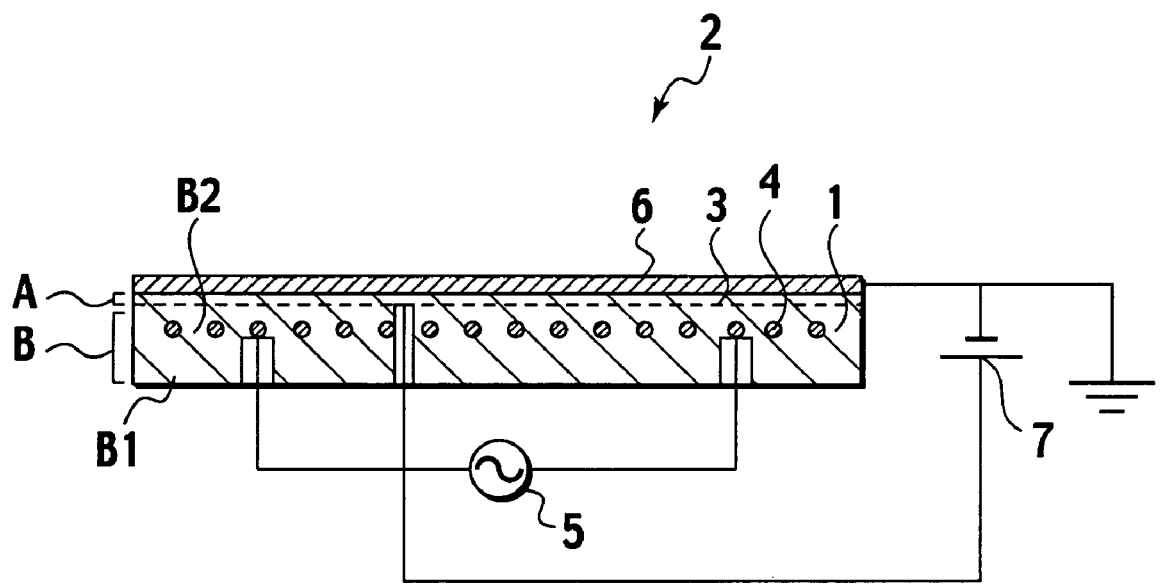
FIG. 1A is a cross-sectional view of an electrostatic chuck heater provided with an aluminum nitride substrate according to one embodiment of the present invention.

FIG. 1A is a longitudinal cross-sectional view of an electrostatic chuck heater 2 adopting an aluminum nitride substrate 1 according to one embodiment of the present invention. The aluminum nitride substrate 1 included in the electrostatic chuck heater 2 is in a disk shape, and has a linear electrostatic electrode 3 (or RF electrode) buried within an upper half of the substrate, and a metal coil 4 buried in the substrate under the electrostatic electrode 3. An AC voltage is applied to the metal coil 4 by an AC power source 5. A wafer 6 is placed on an upper surface of the aluminum nitride substrate 1, and the wafer 6 and the electrostatic electrode 3 are connected to a cathode and an anode of a DC power source 7, respectively. Thus, the wafer 6 and electrostatic electrode 3 are attracted to each other by coulomb forces acting therebetween, and a lower surface of the wafer 6 and an upper surface of the aluminum nitride substrate 1 are attached to each other by Johnson-Rahbeck forces acting therebetween, so that the wafer 6 is fixed to the upper surface of the aluminum nitride substrate 1.

Figure 1B:
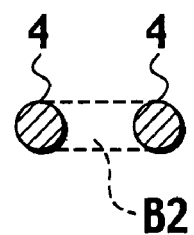
FIG. 1B is an enlarged cross-sectional view of a metal coil.
Figure 2:
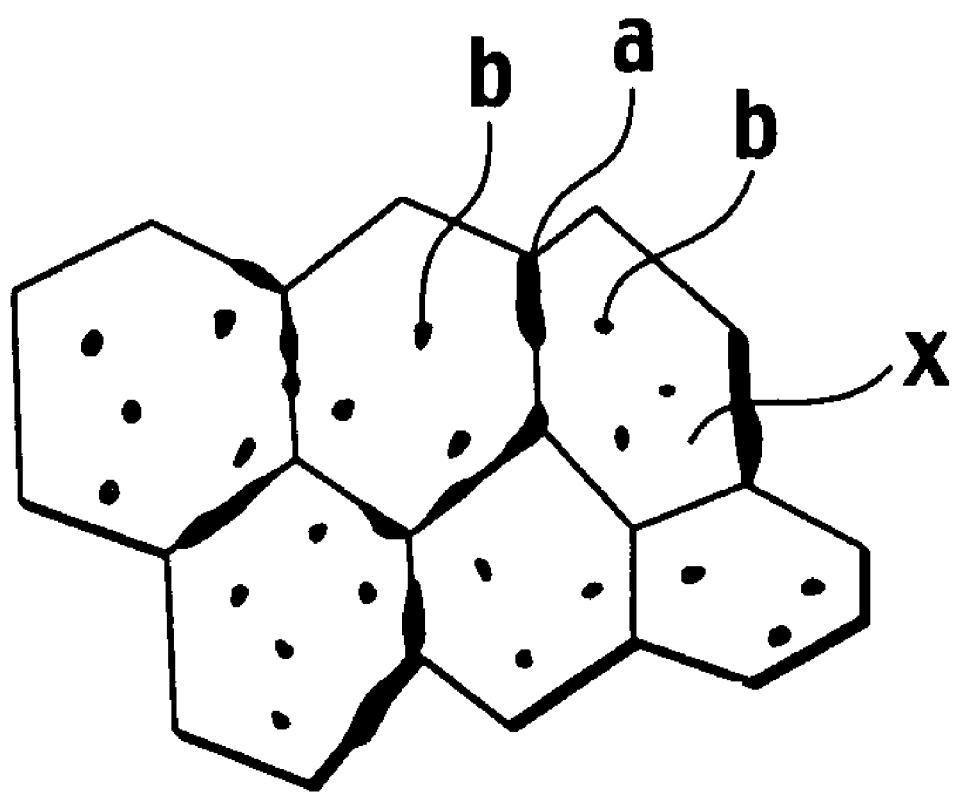
FIG. 2 is a structural view of aluminum nitride forming the aluminum nitride substrate according to the embodiment.

The aluminum nitride substrate 1 is made of a sintered aluminum nitride body containing carbon therein, and particularly contains free carbon which is segregated mainly at a crystal grain boundary. FIG. 2 is a structural view of the sintered aluminum nitride body, in which free carbon "a" is present mainly at a crystal grain boundary of aluminum nitride particles "x", and can be distinguished from solid solute carbon "b" dissolved in the crystal grains in a solid solution state. In FIG. 1A, it is desirable that an average concentration of free carbon on a work mounting portion "A" of the sintered aluminum nitride body for placing a work thereon, is equal to or higher than average concentrations of free carbon present between electrode segments and in a base layer "B" having the electrode buried therein. Note that reference character B1 here designates a region of the base layer "B" under the electrode. FIG. 1B is an enlarged cross-sectional view of the metal coil in the electrostatic chuck heater 2 in FIG. 1A, and reference numeral B2 designates a region between the electrode segments. Further, it is desirable that an average concentration of all carbon per unit volume of the work mounting portion "A" is made higher or lower than an average concentration of all carbon per unit volume of the base layer "B" (including region "B1" under the electrode and regions "B2" between the electrode segments).

As the average concentrations of solid solute carbon increases to decrease the average concentrations of free carbon, a decrease in the volume resistance at high temperatures can be restricted, the leakage current can be decreased, and the separation of crystal grains can be decreased in number. On the other hand, as the average concentrations of solid solute carbon decreases to increase the average concentrations of free carbon, the thermal conductivity is increased. This makes it possible to provide products which satisfy the properties required for the respective portions of a ceramic substrate, by varying the distribution of the average concentration of solid solute carbon or free carbon in a sintered aluminum nitride body.

It is desirable that the average concentration of free carbon within the sintered aluminum nitride body is 500 ppm or lower. This is because higher average concentrations of free carbon lead to higher thermal conductivities, but average concentrations of free carbon exceeding 500 ppm lead to rather complicated firing. Particularly, average concentrations of free carbon are preferably within a range of 10 ppm to 200 ppm. Further, since the average concentrations of all of the carbon in the sintered aluminum nitride body exceeding 600 ppm leads to complicated firing, it is desirable that the average concentration of all carbon is preferably 600 ppm or lower, particularly within a range of 300 ppm to 550 ppm.

The electrostatic electrode 3 may be made of an electric conductor in a linear or planar shape, without being limited thereto. A metal bulk body, a printed body, and electrodes in meshed shape, foil-like shape, punching-metal shape, and electroconductive paste state, respectively can be used as the electrostatic electrode 3.

A method of producing an aluminum nitride substrate according to the present invention is explained with reference to FIG. 3.

As shown in FIG. 3(a), aluminum nitride (AlN) powders 8a, 8b and carbon powders 9a, 9b at carbon concentrations of 600 ppm or lower, respectively, are loaded into vessels 10a, 10b, to prepare two types of starting materials having different carbon concentrations, respectively.

Here, the aluminum nitride powders 8a, 8b are provided by producing aluminum nitride (AlN) powders by the following reactions while adopting a reductive nitriding method or direct nitriding method:

Reductive nitriding method: $Al_2O_3+3C+N_2 \rightarrow 2AlN+3CO$; and

Direct nitriding method: $Al(C_2H_5)_3+NH_3 \rightarrow AlN+3C_2H_5$, $2Al+N_2 \rightarrow 2AlN$.

Meanwhile, examples of suitable carbon powders 9a, 9b include powders of carbon such as carbon black, graphite, carbon-containing resins, which are spattering organic resins comprising powders of organic resin (such as phenol resin), and intermediate products of aluminum nitride having higher carbon concentrations that are produced during the reductive nitriding. Concentrations of the carbon powders 9a, 9b to be added to the aluminum nitride powders 8a, 8b are preferably 600 ppm or lower, because concentrations exceeding 600 ppm make it impossible to maintain the average concentrations of carbon within the sintered aluminum nitride body after firing to remain within a preset range. Concentrations of the carbon powders 9a, 9b to be contained in the aluminum nitride powders 8a, 8b are preferably within a range of 260 ppm to 450 ppm.

Next, as shown in FIG. 3(b), the aluminum nitride (AlN) powders 8a, 8b and the carbon powders 9a, 9b are mixed with each other within the vessels 10a, 10b to obtain starting material powders, respectively. Note that the aluminum nitride powders 8a, 8b and carbon powders 9a, 9b may be mixed with each other, respectively, by wet mixing, which utilizes an organic solvent, or by dry mixing (such as ball milling, vibration milling, or dry bag mixing).

Thereafter, the two types of aluminum nitride powders containing carbon added thereto are loaded into a mold along with another aluminum nitride powder in a three-layered manner to define an aluminum nitride powder, another aluminum nitride powder including a heater electrode buried therein, and still another aluminum nitride powder including an electrostatic electrode buried therein, and then these powders are molded. This yields a three-layered aluminum nitride mold 16 formed of an aluminum nitride layer 11, an aluminum nitride layer 13 over it and having a heater electrode 12 buried therein, and an aluminum nitride layer 15 over it and having an electrostatic electrode 14 buried therein, as shown in FIG. 3(c) (molding step).

After molding, the aluminum nitride mold 16 is placed in a hot pressing apparatus 17 as shown in FIG. 3(d), and fired therein by hot pressing. Firing conditions preferably include a firing temperature of 1,700° C. to 1,950° C., a highest temperature hold time of 0.5 hr to 100 hr, a pressure of 50 kg/cm$^2$ to 250 kg/cm$^2$, a temperature elevation rate of 10° C./hr to 120° C./hr, and a degree of vacuum of $1.3 \times 10^{-1}$ Pa to 133.3 Pa.

The reason why the firing temperature is set at 1,700° C. to 1,950° C. is because firing temperatures below 1,700° C. tend to complicate the dissolution of carbon into a solid solution state, whereas firing temperatures exceeding 1,950° C. cause color irregularities that considerably deteriorate the commercial value of the product. Further, firing in a high temperature range allows promotion of dissolution of carbon.

The reason why the highest temperature hold time at firing is set within the range of 0.5 hr to 100 hr, is because hold times shorter than 0.5 hr lead to insufficient amounts of solid solute carbon, whereas hold times exceeding 100 hr lead to prolonged producing times. Note that prolonged highest temperature hold times at about 1,950° C. allow an increased dissolution of carbon.

Pressures are preferably within a range of 50 kg/cm$^2$ to 250 kg/cm$^2$. This is because, higher pressures exceeding 250 kg/cm$^2$ fail to obtain effects commensurate with such higher pressures, and whereas pressures below 50 kg/cm$^2$ lead to deteriorated sintering abilities. Note that although firing with the application of pressure of about 250 kg/cm$^2$ promotes the dissolution of carbon into a solid solution state, the pressure is preferably varied depending on firing temperatures. For example, firing at higher firing temperatures and higher pressures promotes the dissolution of carbon into a solid solution state, whereas firing at lower firing temperatures and higher pressures provides an increased average concentration of carbon contained in the aluminum nitride substrate.

The temperature elevation rates are preferably within a range of 10° C./hr to 120° C./hr. This is because temperature elevation rates slower than 10° C./hr tend to reduce the differences between the average concentrations of carbon at the inner and outer portions of the aluminum nitride substrate (sintered body), whereas temperature elevation rates exceeding 120° C./hr result in cracking and/or deformation of the sintered body. Note that larger temperature elevation rates allow increased differences between average concentrations of carbon as mentioned above.

The degree of vacuum at firing is preferably set at $1.3 \times 10^{-1}$ Pa to 133.3 Pa. This is because a degree of vacuum that is less than $1.3 \times 10^{-1}$ Pa leads to higher average concentrations of carbon at the outer portion of the aluminum nitride substrate, and a degree of vacuum exceeding 133.3 Pa leads to excessively smaller average concentrations of carbon at the outer portion of the aluminum nitride substrate. Further, setting the atmosphere upon firing to a degree of vacuum of about 133.3 Pa provides smaller average concentrations of carbon at the outer portion of the aluminum nitride substrate.

Note that the firing method is not limited to the above-mentioned hot pressing method, and other methods may be adopted. In the latter case, there is allowed a difference between amounts of solid solute carbon (or free carbon amounts) at inner and outer portions of an aluminum nitride substrate, respectively, by appropriately combining a firing temperature, a keeping time, a pressure, a temperature elevation rate, and a degree of vacuum, at firing.

Note that a metal coil or a metal mesh is placed within the molded body upon firing, depending on intended properties thereof. In this way, it is possible to determine a cut-out position of a product by utilizing the differences in the amounts of solid solute carbon and free carbon in a sintered body, while placing the metal coil and metal mesh within the molding.

As shown in FIG. 3(e), a fired aluminum nitride substrate 18 formed of: an aluminum nitride layer 19 comprising a sintered aluminum nitride body having a higher average concentration of free carbon, an aluminum nitride layer 20 over the aluminum nitride layer 19 comprising a sintered aluminum nitride body having a lower average concentration of free carbon (i.e., a higher average concentration of solid solute carbon) and having the heater electrode 12 buried therein, and an aluminum nitride layer 21 over the aluminum nitride layer 20, comprising a sintered aluminum nitride body having a higher average concentration of free carbon, and having the electrostatic electrode 14 buried therein.

Note that the average concentrations of free carbon can be measured by an infrared absorption method, by quantifying the amount of $CO_x$ generated upon heating a sintered aluminum nitride body at 900° C. Meanwhile, the average concentration of all carbon including free carbon and solid solute carbon is a value obtained by the infrared absorption method by quantifying the amount of $CO_x$ generated upon high-frequency heating or heating at 1,350° C. (with an addition of flux), and this quantification can be conducted by a method (JCRS105-1995) for analyzing the amount of C within AlN, which meets the standards of the Ceramic Society of Japan.

Then, a predetermined region 22 is cut out from the aluminum nitride substrate 18 as shown in FIG. 3(f), to obtain an aluminum nitride substrate 23 shown in FIG. 3(g).

Note that the production method of an aluminum nitride substrate is not limited to the producing steps shown in FIG. 3, and the substrate may also be produced by the steps shown in FIG. 4. In FIG. 4, like reference numerals used for the steps in FIG. 3 are used to denote corresponding portions, and the repeat explanation thereof is omitted.

As shown in FIG. 4(a) and FIG. 4(b), starting materials of two types of aluminum nitride powders having different carbon concentrations of 600 ppm or lower are prepared.

Thereafter, the two types of aluminum nitride powders containing carbon powders added thereto loaded into a mold along with another aluminum nitride powder in a three layered manner to define an aluminum nitride powder, another aluminum nitride powder including an electrostatic electrode buried therein, and still another aluminum nitride powder including a heater electrode buried therein, and then these powders are molded. This yields a three-layered aluminum nitride mold 27 formed of an aluminum nitride layer 24, an aluminum nitride layer 25 over it and having an electrostatic electrode 14 buried therein, and an aluminum nitride layer 26 over it and having a heater electrode 12 buried therein, as shown in FIG. 4(c) (molding step).

After molding, the aluminum nitride mold 27 is placed in a hot pressing apparatus 17 as shown in FIG. 4(d), and fired therein by hot pressing (firing step) into a three-layered sintered aluminum nitride body 28. As shown FIG. 4(e), the sintered aluminum nitride body 28 is formed of an aluminum nitride layer 29 comprising a sintered aluminum nitride body having a lower average concentration of solid solute carbon, an aluminum nitride layer 30 over the aluminum nitride layer 29, comprising a sintered aluminum nitride body having a higher average concentration of solid solute carbon and having the electrostatic electrode 14 buried therein, and an aluminum nitride layer 31 over the aluminum nitride layer 30 having the heater electrode 12 buried therein.

Then, a predetermined region 32 is cut out from the sintered aluminum nitride body 28 as shown in FIG. 4(f), to obtain the aluminum nitride substrate 33 shown in FIG. 4(g).

Note that although this embodiment has been described by the examples where the aluminum nitride substrates 23,33 having both the heater electrode 12 and the electrostatic electrode 14 buried therein are used as electrostatic chuck heaters, respectively, the invention is not limited to an electrostatic chuck heater, and it is possible to use the aluminum nitride substrate as a ceramic heater having only a heater electrode 12 buried therein, an electrostatic chuck having only an electrostatic electrode 14 buried therein, or a high-frequency generating electrode device having a plasma-generating electrode buried therein. In embodiments of the present invention and in the case of configurations other than an electrostatic chuck, the work mounting portion "A," and the region "B1" under an electrode and the region "B2" between electrode segments in the base layer "B," refer to the following regions, respectively.

Figure 5A:
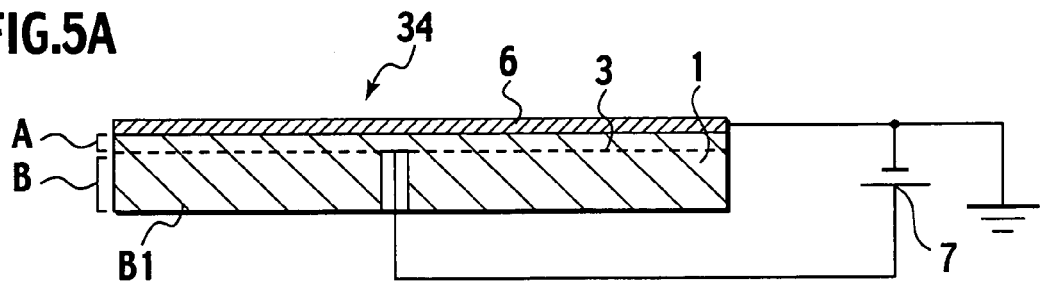
FIG. 5A is a cross-sectional view of a single electrode type electrostatic chuck provided with an aluminum nitride substrate according to another embodiment of the invention.
Figure 5B:
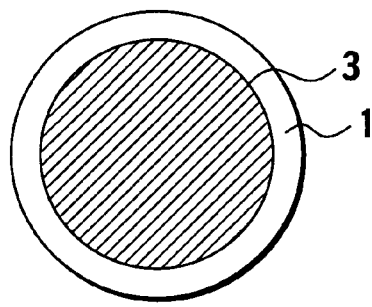
FIG. 5B is a radial cross-sectional view of the electrostatic electrode portion of the chuck.

Namely, FIG. 5A shows a longitudinal cross-sectional view of a single electrode type of electrostatic chuck 34 adopting the aluminum nitride substrate 1 according to another embodiment of the present invention, and FIG. 5B shows a radial cross-sectional view through an electrostatic electrode 3 of the electrostatic chuck 34. Note that like reference numerals as used for the electrostatic chuck heater shown in FIG. 1 are used to denote corresponding elements, and the repeat explanation thereof is omitted. As shown in FIG. 5A and FIG. 5B, the electrostatic chuck 34 exhibits a work mounting portion "A" which is a region over the electrostatic electrode 3, and a base layer "B" having the electrostatic electrode 3 buried therein, the base layer "B" including a region "B1" under the electrostatic electrode 3.

Figure 6A:
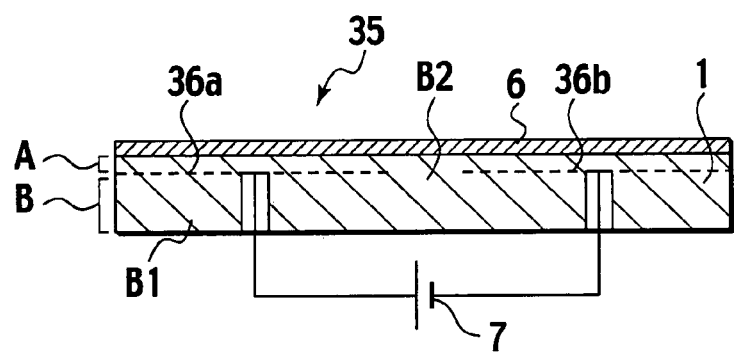
FIG. 6A is a cross-sectional view of a dual electrode type electrostatic chuck provided with an aluminum nitride substrate according to another embodiment of the present invention.
Figure 6B:
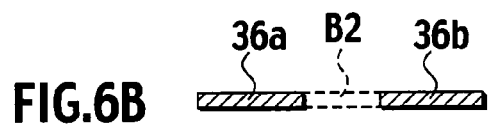
FIG. 6B is an axial cross-sectional view of the electrostatic electrode portion of the chuck.
Figure 6C:
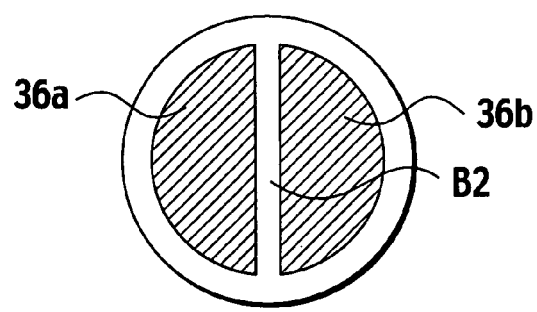
FIG. 6C is a radial cross-sectional view of the electrostatic electrode portion.

Further, FIG. 6A is a cross-sectional view of a dual electrode type of electrostatic chuck 35 adopting the aluminum nitride substrate 1 according to still another embodiment of the invention, FIG. 6B is an axial cross-sectional view of electrostatic electrodes 36a, 36b, and FIG. 6C is a radial cross-sectional view of the electrostatic electrodes 36a, 36b. As shown in FIG. 6A through FIG. 6C, the electrostatic chuck 35 has the electrostatic electrodes 36a, 36b buried therein, which comprise metal meshes separated from each other at central portions thereof in a left-right symmetric manner. The substrate exhibits a work mounting portion "A" which is a region over the electrostatic electrodes 36a, 36b, and a base layer "B" including a region "B1" under the electrostatic electrodes 36a, 36b and a region "B2" between the right and left electrostatic electrodes.

Figure 7A:
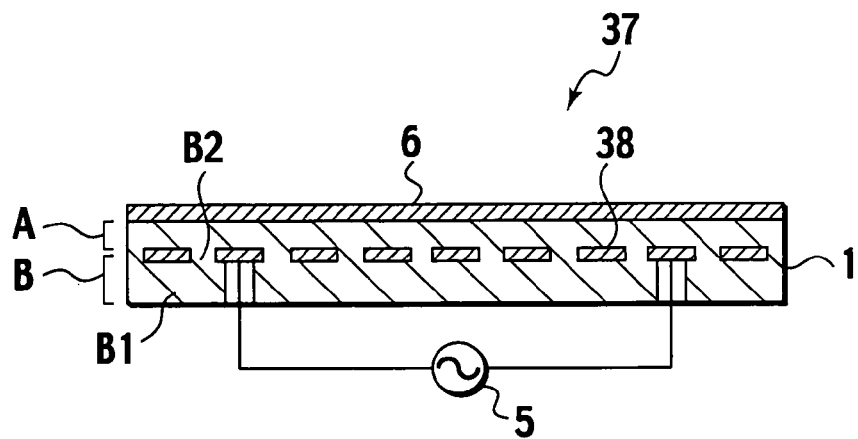
FIG. 7A is a cross-sectional view of a heater provided with an aluminum nitride substrate according to another embodiment of the present invention.
Figure 7B:
FIG. 7B is an axial cross-sectional view of the metal foil portion as a heater electrode.

Further, FIG. 7A is a longitudinal cross-sectional view of a heater 37 including an aluminum nitride substrate 1 according to yet another embodiment of the present invention. The heater 37 includes a metal foil 38 helically buried, as a heater electrode, within the aluminum nitride substrate 1. FIG. 7B is an axial cross-sectional view through the metal foil 38. The heater 37 shown in FIG. 7A and FIG. 7B exhibits a work mounting portion "A" which is a region over the metal foil 38, and a base layer "B" including a region "B1" under the metal foil 38 and a region "B2" between adjacent segments of the metal foil 38.

Figure 8A:
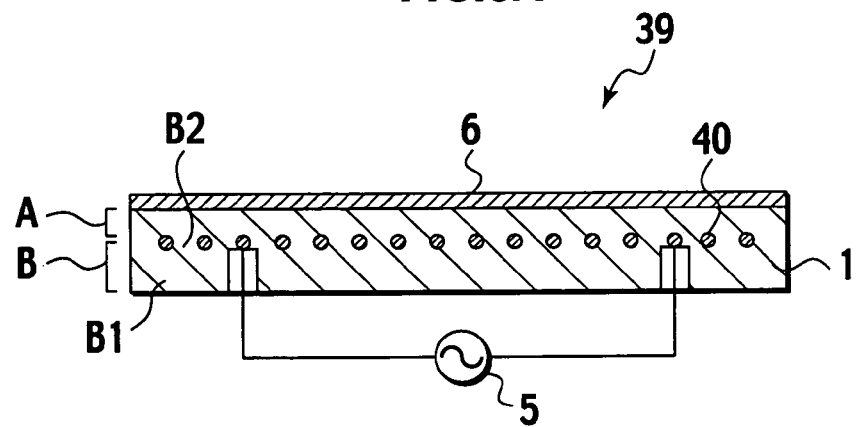
FIG. 8A is a cross-sectional view of a heater provided with an aluminum nitride substrate according to a further embodiment of the present invention.
Figure 8B:
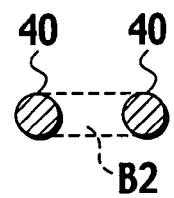
FIG. 8B is an axial cross-sectional view of the metal coil portion as a heater electrode.

FIG. 8A is a longitudinal cross-sectional view of a heater 39 in a modified electrode configuration provided by adopting the aluminum nitride substrate 1 according to yet another embodiment of the invention. The heater 39 has a metal coil 40 as a heater electrode buried within the aluminum nitride substrate 1. FIG. 8B is an axial cross-sectional view of the metal coil 40. In this case, the substrate exhibits a work mounting portion "A" comprising a region over the metal coil 40, and a base layer "B" including a region "B1" under the metal coil 40 and a region "B2" between adjacent segments of the metal coil 40.

The present invention is further described by concrete Examples.

EXAMPLE 1

The aluminum nitride substrate of Example 1 was made using the production steps shown in FIG. 3.

First, carbon was added to an aluminum nitride powder to prepare two kinds of aluminum nitride powders having different carbon concentrations of 500 ppm or lower.

Next, the prepared aluminum nitride powders were used together with an HT coil as a heater electrode and an RF mesh as an electrostatic electrode, and formed into a molded body.

Thereafter, the obtained molded body was fired under the conditions shown in Table 1 to obtain a sintered aluminum nitride body having a thickness of 25 mm. The carbon concentration distribution "E" was attained by controlling the firing conditions as shown in Table 1 to adjust the amount of solid solute carbon and the amount of free carbon.

TABLE 1

| | | Ex. 1 | Ex. 2 | Ex. 3 | Ex. 4 | Com. Ex. 1 | Com. Ex. 2 |
|---|---|---|---|---|---|---|---|
| Starting Material | Carbon concentration (ppm) in AlN powder | 500 | 550 | 300 | 300 | 300 | 250 |
| Firing conditions | Firing temperature (°C.) | 1800 | 1800 | 1750 | 1750 | 1820 | 1850 |
| | Holding time (hr) | 1 | 1 | 2 | 2 | 1 | 40 |
| | Pressure (kg/cm$^2$) | 90 | 90 | 60 | 60 | 200 | 85 |
| | Temperature elevation rate (°C./hr) | 80 | 80 | 100 | 100 | 25 | 30 |
| | Degree of vacuum (Pa) | 13.33 | 13.33 | 6.66 | 6.66 | 13.33 | 6.66 |
| Sintered aluminium nitride body | Carbon concentration distribution in sintered AlN body | E | F | E | F | Uniform | Uniform |
| | Volume resistivity (W × cm) at RT, of regions over/under electrode | $1 \times 10^{15}/$ $1 \times 10^{15}$ | $1 \times 10^{15}/$ $1 \times 10^{15}$ | $5 \times 10^{15}/$ $5 \times 10^{15}$ | $5 \times 10^{15}/$ $5 \times 10^{15}$ | $8 \times 10^{14}/$ $8 \times 10^{14}$ | $6 \times 10^{14}/$ $6 \times 10^{14}$ |
| | Volume resistivity (W × cm) at 400°C., of regions over/under electrode | $5 \times 10^{11}/$ $5 \times 10^{10}$ | $5 \times 10^{10}/$ $5 \times 10^{11}$ | $1 \times 10^{12}/$ $1 \times 10^{11}$ | $1 \times 10^{11}/$ $1 \times 10^{12}$ | $1 \times 10^{10}/$ $1 \times 10^{10}$ | $1 \times 10^{10}/$ $1 \times 10^{10}$ |
| | Thermal conductivity (W/mK) at RT, of regions over/under electrode | 160/150 | 150/160 | 155/145 | 145/155 | 145/145 | 140/140 |
| | Grain separation property (number of separated grains) | 69 | 32 | 88 | 36 | 68 | 74 |

The aluminum nitride substrate having the carbon concentration distribution "E" exhibited a work mounting portion "A" having an average concentration of free carbon that was higher than an average concentration of free carbon in the base layer "B" (region "B1" under the electrode, and the region "B2" between segments of the electrode). The work mounting portion "A" had an average concentration of free carbon of 80 ppm, the region "B1" under the electrode had an average concentration of free carbon of 30 ppm, and the region "B2" between the electrode segments had an average concentration of free carbon of 60 ppm. Further, the average concentration of all carbon per unit volume of the work mounting portion "A" was lower than the average concentrations of all carbon per unit volume of the region "B1" under the electrode and the region "B2" between electrode segments. The work mounting portion "A" had an average concentration of all carbon of 380 ppm, the region "B1" under the electrode had an average concentration of all carbon of 460 ppm, and the region "B2" between electrode segments had an average concentration of all carbon of 420 ppm. Moreover, the average concentration of solid solute carbon of the work mounting portion "A" was lower than average concentrations of solid solute carbon in the region "B1" under the electrode and the region "B2" between the electrode segments. The work mounting portion "A" had an average concentration of solid solute carbon of 300 ppm, the region "B1" under the electrode had an average concentration of solid solute carbon of 430 ppm, and the region "B2" between the electrode segments had an average concentration of solid solute carbon of 360 ppm.

EXAMPLE 2

A sintered aluminum nitride body was produced in Example 2 using the production method shown in FIG. 3 in the same manner as Example 1. Example 2 differed from Example 1 in that the carbon concentration distribution in the sintered aluminum nitride body of Example 1 was changed. Namely, a carbon concentration distribution "F" was attained in Example 2 by controlling the firing condition as shown in Table 1 to adjust the amount of solid solute carbon and the amount of free carbon.

The aluminum nitride substrate having the carbon concentration distribution "F" exhibited a work mounting portion "A" having an average concentration of free carbon that was higher than average concentrations of free carbon in the region "B1" under the electrode and the region "B2" between the electrode segments. The work mounting portion "A" had an average concentration of free carbon of 100 ppm, the region "B1" under the electrode had an average concentration of free carbon of 90 ppm, and the region "B2" between electrode segments had an average concentration of free carbon of 95 ppm. Further, the average concentration of all carbon per unit volume, of the work mounting portion "A" was higher than average concentrations of all carbon per unit volume in the region "B1" under the electrode and the region "B2" between electrode segments. The average concentration of all carbon of working mounting portion "A" was 550 ppm, the region "B1" under the electrode had an average concentration of all carbon of 500 ppm, and the region "B2" between electrode segments had an average concentration of all carbon of 520 ppm. Moreover, the average concentration of solid solute carbon of the work mounting portion "A" was higher than average concentrations of solid solute carbon in the region "B1" under the electrode and the region "B2" between the electrode segments. The work mounting portion "A" had an average concentration of all solidly dissolved carbon of 450 ppm, the region "B1" under the electrode had the average concentration of all solidly dissolved carbon of 410 ppm, and the region "B2" between the electrode segments had an average concentration of all solidly dissolved carbon of 425 ppm.

EXAMPLE 3

In Example 3, the firing conditions of Example 1 were changed while aluminum nitride powders having carbon concentrations of 300 ppm or lower were used to fabricate a sintered aluminum nitride body, (substrate) having a carbon concentration distribution "E." Concretely, the work mounting portion "A" had an average concentration of free carbon of 120 ppm, the region "B1" under the electrode had an average concentration of free carbon of 40 ppm, and the region "B2" between the electrode segments had an average concentration of free carbon of 70 ppm. Further, the work mounting portion "A" had an average concentration of all carbon of 185 ppm, the region "B1" under the electrode had an average concentration of all carbon of 280 ppm, and the region "B2" between the electrode segments had an average concentration of all carbon of 230 ppm. Moreover, the work mounting portion "A" had an average concentration of solid solute carbon of 65 ppm, the region "B1" under the electrode had an average concentration of solid solute carbon of 240 ppm, and the region "B2" between the electrode segments had an average concentration of solid solute carbon of 160 ppm.

EXAMPLE 4

In Example 4, the same firing conditions as that of Example 1 were used, while aluminum nitride powders having carbon concentrations of 300 ppm or lower were used to fabricate a sintered aluminum nitride body (substrate) having a carbon concentration distribution "F". Concretely, the work mounting portion "A" had an average concentration of free carbon of 110 ppm, the region "B1" under the electrode had an average concentration of free carbon of 45 ppm, and the region "B2" between the electrode segments had an average concentration of free carbon of 75 ppm. Further, the work mounting portion "A" had an average concentration of all carbon of 295 ppm, the region "B1" under the electrode had an average concentration of all carbon of 180 ppm, and the region "B2" between the electrode segments had an average concentration of all carbon of 235 ppm. Moreover, the work mounting portion "A" had an average concentration of solid solute carbon of 185 ppm, the region "B1" under the electrode had an average concentration of solid solute carbon of 135 ppm, and the region "B2" between the electrode segments had an average concentration of solid solute carbon of 160 ppm.

COMPARATIVE EXAMPLE 1

In Comparative Example 1, a different firing condition was used, while an aluminum nitride powder having a carbon concentration of 300 ppm or lower was used to fabricate a sintered aluminum nitride body (substrate) having a uniform carbon distribution.

COMPARATIVE EXAMPLE 2

In Comparative Example 2, another different firing condition was used, while an aluminum nitride powder having a carbon concentration of 250 ppm or lower was used to fabricate a sintered aluminum nitride body, as an aluminum nitride substrate having a uniform carbon distribution.

The aluminum nitride substrates obtained in the Example 1 through Example 4, and Comparative Example 1 and Comparative Example 2 were used to evaluate the volume resistivity, thermal conductivity, and grain separation property thereof.

The volume resistivity was measured over a range from a room temperature (38° C.) to a high temperature (400° C.) under a vacuum in conformity to JIS C2141, by using a super-insulation resistance/minute electric current meter (TR8601: ADVANTEST). The volume resistivity was measured using a test piece in a shape of 450 mm×1 mm or 50 mm×50 mm×1 mm, and electrodes were formed of silver such that a main electrode diameter was 20 mm, a guard electrode inner diameter was 30 mm, a guard electrode outer diameter was 40 mm, and an application electrode diameter was 40 mm. Each electric current value was read after a lapse of one minute from the application of a voltage of 500V, to calculate the volume resistivity.

The thermal conductivity was measured by a laser flash method by using a thermal constant measuring apparatus (LF/TCM-FA8510B, manufactured by Rigaku Corporation).

The grain separation property was evaluated as follows. First, an electrode was formed on a mirror-finished side of each disk-like test piece, while placing a silicon wafer having a diameter of 150 mm on a heater. Further, the disk-like test piece was stackedly placed on the silicon wafer such that the mirror-finished side of the test piece contacted the silicon wafer. Then, the heater was energized to stabilize the temperature of the disk-like test piece at 400° C., followed by the application of a voltage of 500V between the silicon wafer and the disk-like test piece so that the silicon wafer and test piece were attracted to each other for one minute. Thereafter, cooling was conducted, and a portion of 10 mm$^2$ to 50 mm$^2$ of the disk-like test piece was used for observation by an electron microscope. The number of separated aluminum nitride grains was counted using the electron microscope, and the number of grains per predetermined area. (4,416 mm$^2$) having a diameter of 75 mm was calculated as exemplified by the result shown in Table 1.

As seen from the aluminum nitride substrate according to each of the Comparative Examples in Table 1, it was possible to enhance the soaking ability of the aluminum nitride substrate itself by providing a uniform average concentration of solid solute carbon in the corresponding sintered aluminum nitride body. On the other hand, in each of the aluminum nitride substrates according to Example 1 through Example 4, the average concentration of solid solute carbon or free carbon in the corresponding sintered aluminum nitride bodies was non-uniform, thereby enabling the assurance of a quality that is commensurate with the required properties. It became particularly apparent that in Example 2 and Example 4, since the average concentrations of solid solute carbon in the region "B1" under the electrode and the region "B2" between the electrode segments were made lower than that of the work mounting portion "A," and the average concentration of free carbon on the electrode surface increased, the thermal conductivity of the aluminum nitride substrate surface was enhanced so that the soaking ability of the aluminum nitride substrate was improved. Further, in the aluminum nitride substrates of Example 1 and Example 3, the decrease of volume resistivity in a high temperature range of about 400° C. was restricted between the electrostatic electrode and the heater electrode, or between the RF terminal hole and the HT terminal holes, thereby decreasing the leakage current.

On the other hand, it became apparent that, in Example 1 and Example 3, since the average concentrations of solid solute carbon in the region "B1" under the electrode and the region "B2" between the electrode segments were made higher than that of the work mounting portion "A," and the average concentration of free carbon at grain boundary surfaces decreased, a decrease in the number of grain separation at the surface of the aluminum nitride substrate was enabled. Further, in view of the tendency of the application of pressure onto an aluminum nitride substrate surface to promote grain separation, the aluminum nitride substrates according to Example 1 and Example 3, in which the average concentrations of solid solute carbon in the region "B1" under the electrode and the region "B2" between the electrode segments are higher than that of the work mounting portion "A", are particularly useful in situations where the aluminum nitride substrate is to be mirror-finished, thereby enabling a decrease in the grain separation number and an assurance of quality that is commensurate with the required properties.

The contents of Japanese Patent Application No. 2004-096032, filed to the Japanese Patent Office on Mar. 29, 2004, are incorporated herein by reference.

Although the present invention has been described based on the embodiments, the invention is not limited thereto, and various modifications may be made thereto without departing from the spirit or scope of the invention.

The invention claimed is:

1. An aluminum nitride substrate comprising:
   a planar sintered aluminum nitride body containing carbon and including free carbon, the sintered aluminum nitride body comprising a work mounting portion for placing a work thereon and a base layer; and
   an electrode having a substantially planar configuration buried in the base layer of the sintered aluminum nitride body;
   wherein an average concentration of free carbon in the work mounting portion is higher than an average concentration of free carbon in the base layer, and wherein the average concentrations of free carbon are 500 ppm or lower;
   wherein an average concentration of all carbon per unit volume of the work mounting portion is lower than an average concentration of all carbon per unit volume of the base layer; and
   wherein the average concentration of free carbon is greater than 80 ppm in the work mounting portion, and wherein the average concentration of free carbon is not greater than 70 ppm in both of a region of the base layer between planar segments of the electrode and a region of the base layer below the electrode.

2. The aluminum nitride substrate as claimed in claim 1, wherein the aluminum nitride substrate is used as a ceramic substrate for a semiconductor production and/or inspection apparatus.

3. The aluminum nitride substrate as claimed in claim 1, wherein the free carbon is present mainly at a grain boundary between aluminum nitride crystal grains of the sintered aluminum nitride body and is different from an amount of solid solute carbon dissolved in the crystal grains of the sintered aluminum nitride body.

* * * * *